United States Patent
Chiu

(10) Patent No.: US 7,456,721 B2
(45) Date of Patent: Nov. 25, 2008

(54) ON-CHIP TRANSFORMER BALUN

(75) Inventor: Pei-Ju Chiu, Wurih Township, Taichung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/889,831

(22) Filed: Aug. 16, 2007

(65) Prior Publication Data
US 2008/0042792 A1 Feb. 21, 2008

(30) Foreign Application Priority Data
Aug. 16, 2006 (TW) .............................. 95130029 A

(51) Int. Cl.
*H01F 5/00* (2006.01)
(52) U.S. Cl. .................... 336/200; 336/223; 336/232
(58) Field of Classification Search ................ 336/200, 336/223, 232
See application file for complete search history.

(56) References Cited

U.S. PATENT DOCUMENTS

| | | | |
|---|---|---|---|
| 5,446,311 A | 8/1995 | Ewen et al. | |
| 6,037,649 A | 3/2000 | Liou | |
| 6,476,704 B2 * | 11/2002 | Goff | ........................... 336/200 |
| 6,608,364 B2 * | 8/2003 | Carpentier | ................... 257/531 |
| 7,088,214 B2 * | 8/2006 | Castaneda et al. | ........... 336/200 |
| 7,171,739 B2 * | 2/2007 | Yang et al. | .................. 29/602.1 |
| 7,199,682 B2 * | 4/2007 | Ezzeddine | ................... 333/177 |
| 7,253,712 B1 * | 8/2007 | Papananos | ................... 336/200 |
| 2003/0151881 A1 | 8/2003 | Yue | |
| 2004/0207504 A1 | 10/2004 | Yang et al. | |

OTHER PUBLICATIONS

A Fully Integrated 5.3-GHz 2.4-V 0.3-W SiGe Bipolar Power Amplifier With 50-Ω Omega Output, IEEE Journal of Solid-State Circuits, vol. 39, No. 7, Jul. 2004.

* cited by examiner

*Primary Examiner*—Anh T Mai
(74) *Attorney, Agent, or Firm*—Birch, Stewart, Kolasch and Birch, LLP

(57) ABSTRACT

The invention provides an on-chip transformer balun formed among N successive isolating layers. The transformer includes a primary winding and a secondary winding. The primary winding includes a plurality of first semi-turn coils, a plurality of second semi-turn coils, a plurality of metal junctions, and a plurality of first metal bridges. The secondary winding includes a plurality of third semi-turn coils, a plurality of fourth semi-turn coils, and a plurality of second metal bridges. The first semi-turn coils are connected with the second semi-turn coils by the metal junctions and the first metal bridges. The third semi-turn coils are connected with the fourth semi-turn coils by the second metal bridges. By use of the multi-layer first metal bridges, the transformer according to the invention allows a larger input current than a conventional on-chip transformer.

5 Claims, 5 Drawing Sheets

ON-CHIP TRANSFORMER BALUN

BACKGROUND OF THE INVENTION

1. Field of the Invention

The present invention relates to an on-chip transformer balun, and more particularly, to an on-chip transformer balun capable of sustaining a larger current than a conventional transformer.

2. Description of the Prior Art

Regarding current on-chip transformer baluns, the method of winding in different layers may cause an obvious parasitic-effect problem and decrease the coupling coefficient. However, there is another winding method of winding in the same layer for increasing the coupling coefficient but the winding ratio may not be increased owing to the limited layout area. Moreover, due to the properties of manufacturing process of semiconductor, the circuit on the uppermost layer can sustain a higher current density than the circuit on other layers. Therefore, if the winding has breaches required to be connected by metal bridges, the sustainable current density of the whole circuit would be confined to the sustainable current density of circuits on other layers. As a result, the request of high-to-low impedance transformation is not achieved; especially in the field of power transformation, being unable to increase the ratio of impedance transformation indicates that more transformation stages are required. Namely, the more layout area is required, the more power is lost in the transformation.

Accordingly, providing a transformer balun capable of sustaining a larger current than a conventional transformer is requested.

SUMMARY OF THE INVENTION

One scope of the invention provides an on-chip transformer balun. The on-chip transformer balun is capable of sustaining a larger current than a conventional transformer.

According to a preferred embodiment, the on-chip transformer balun is formed among 7 successive isolating layers from top to bottom on or over a semiconductor substrate. The on-chip transformer balun includes a primary winding and a secondary winding. The primary winding includes a plurality of first wire sections and a first metal bridge. The first wire sections include 3 first semi-turn coils and 3 second semi-turn coils. The first semi-turn coils and the second semi-turn coils are on a primary metal layer, i.e. formed on the first isolating layer among the isolating layers according to the preferred embodiment. Besides, the first metal bridge includes a plurality of first conducting sections and a plurality of first vias. The first conducting sections are located respectively on the metal layers different from the primary metal layer, i.e. formed among the second isolating layer through the 5th isolating layer among the isolating layers according to the preferred embodiment. The first vias couple the first conducting sections and the first wire sections. That is, according to the preferred embodiment, each of the first conducting sections connects one of the first semi-turn coils with one of the second semi-turn coils by use of the first vias formed among the first isolating layer through the 4th isolating layer. Moreover, the primary winding further includes a plurality of metal junctions. The metal junctions are formed on the first isolating layer. Each of the metal junctions connects one of the first semi-turn coils and one of the second semi-turn coils.

The secondary winding includes a plurality of second wire sections and a second metal bridge. The second wire sections include 2 third semi-turn coils and 2 fourth semi-turn coils. The third semi-turn coils and the fourth semi-turn coils are on the primary metal layer, i.e. formed on the first isolating layer among the isolating layers according to the preferred embodiment. The third semi-turn coils are interlaced with the first semi-turn coils. The fourth semi-turn coils are interlaced with the second semi-turn coils. Besides, the second metal bridge includes at least one second conducting section and a plurality of second vias. And, the at least one second conducting section is located respectively on the metal layers different from the primary metal layer, i.e. formed on the 6th isolating layer among the isolating layers according to the preferred embodiment. The second vias couple the at least one second conducting section and the second wire sections. That is, according to the preferred embodiment, each of the second conducting section, by use of the second vias formed among the first isolating layer through the 5th isolating layer among the isolating layers, connects one of the third semi-turn coils and one of the fourth semi-turn coils, or one of the third semi-turn coils and another of the third semi-turn coils, or one of the fourth semi-turn coils and another of the fourth semi-turn coils.

Thereby, a current could flow through the first metal bridge to increase the allowable current. Therefore, the primary winding could sustain a higher current than a conventional on-chip transformer balun in the same ratio of impedance transformation. Besides, the secondary winding is formed with a plurality of coils in parallel, which increases the winding ration of the primary winding and the secondary winding so that the high-to-low impedance transformation could be achieved in the same transformation stage.

Accordingly, the on-chip transformer balun of the invention could sustain a higher current than a conventional transformer, saves the layout area, and reduces the lost in power transformation.

The advantage and spirit of the invention may be further understood by the following recitations together with the appended drawings.

BRIEF DESCRIPTION OF THE APPENDED DRAWINGS

DETAILED DESCRIPTION OF THE INVENTION

Figure 1:
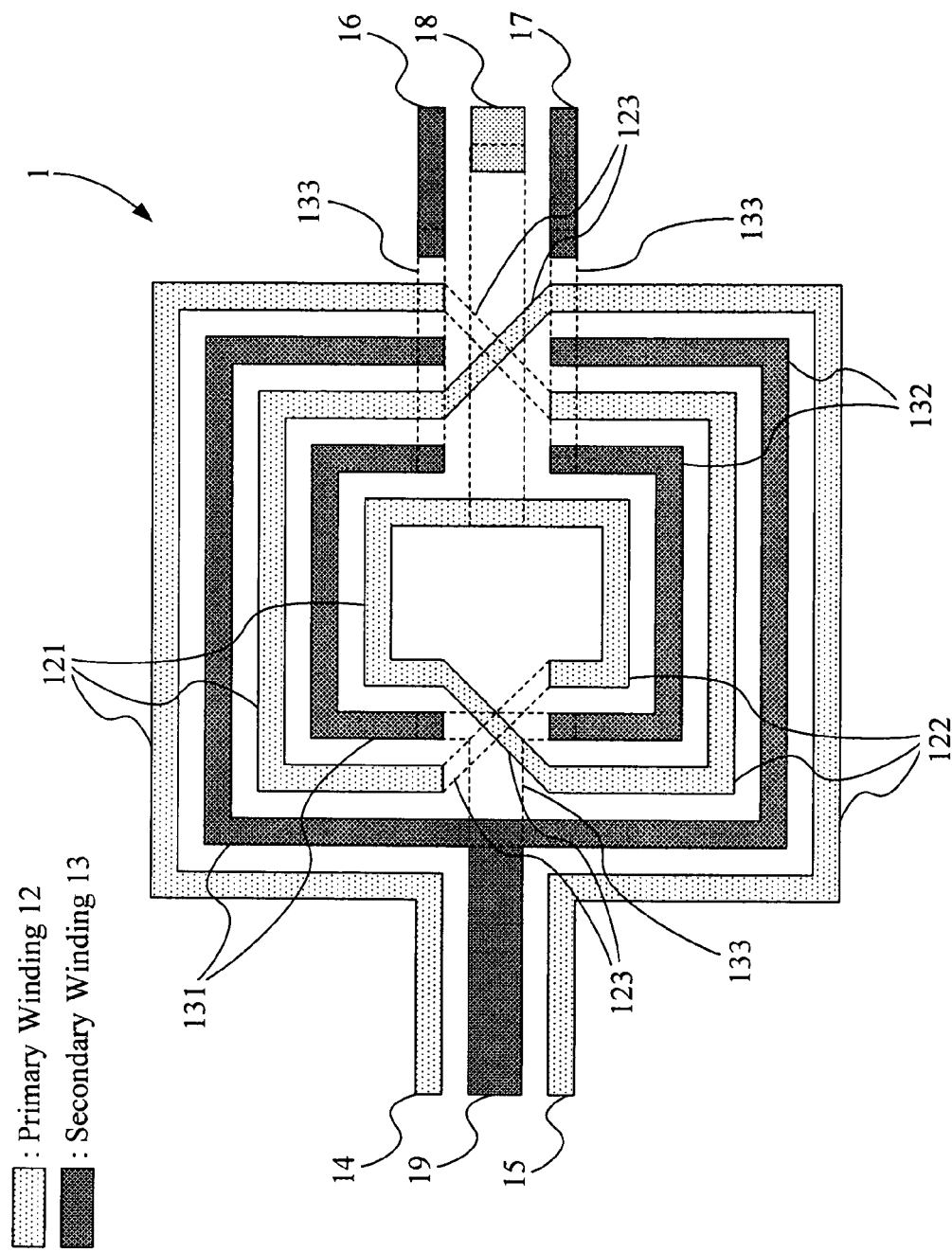
FIG. 1 is a front view of an on-chip transformer balun according to a preferred embodiment of the invention.
Figure 2:
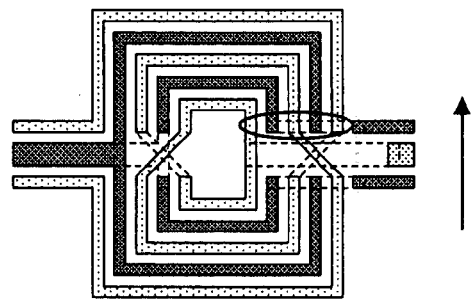
FIG. 2 is a first partial side view of FIG. 1.
Figure 2:
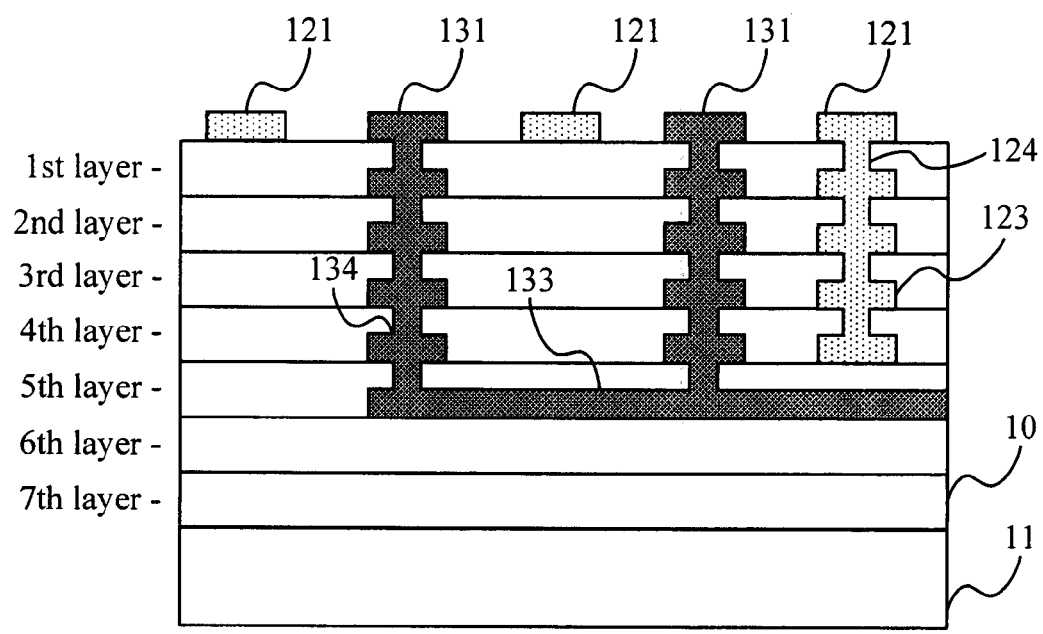
Figure 3:
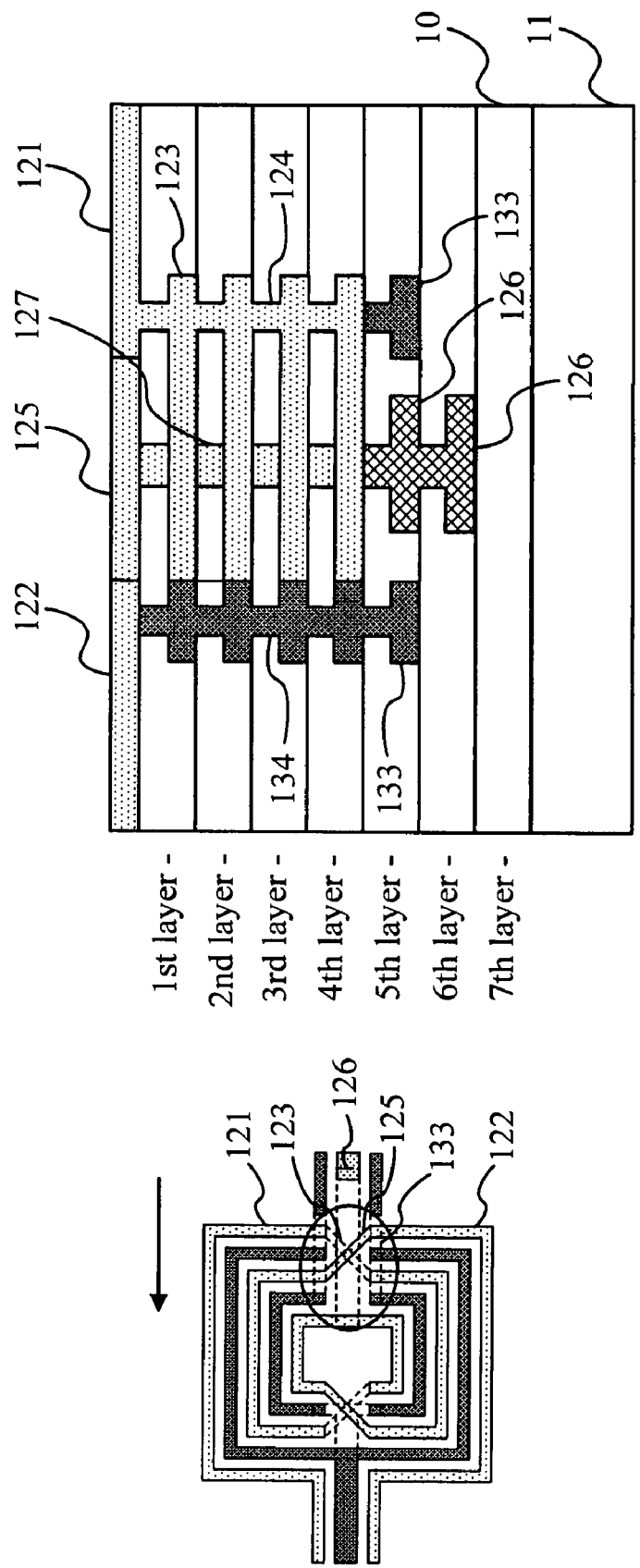
FIG. 3 is a second partial side view of FIG. 1.
Figure 4:
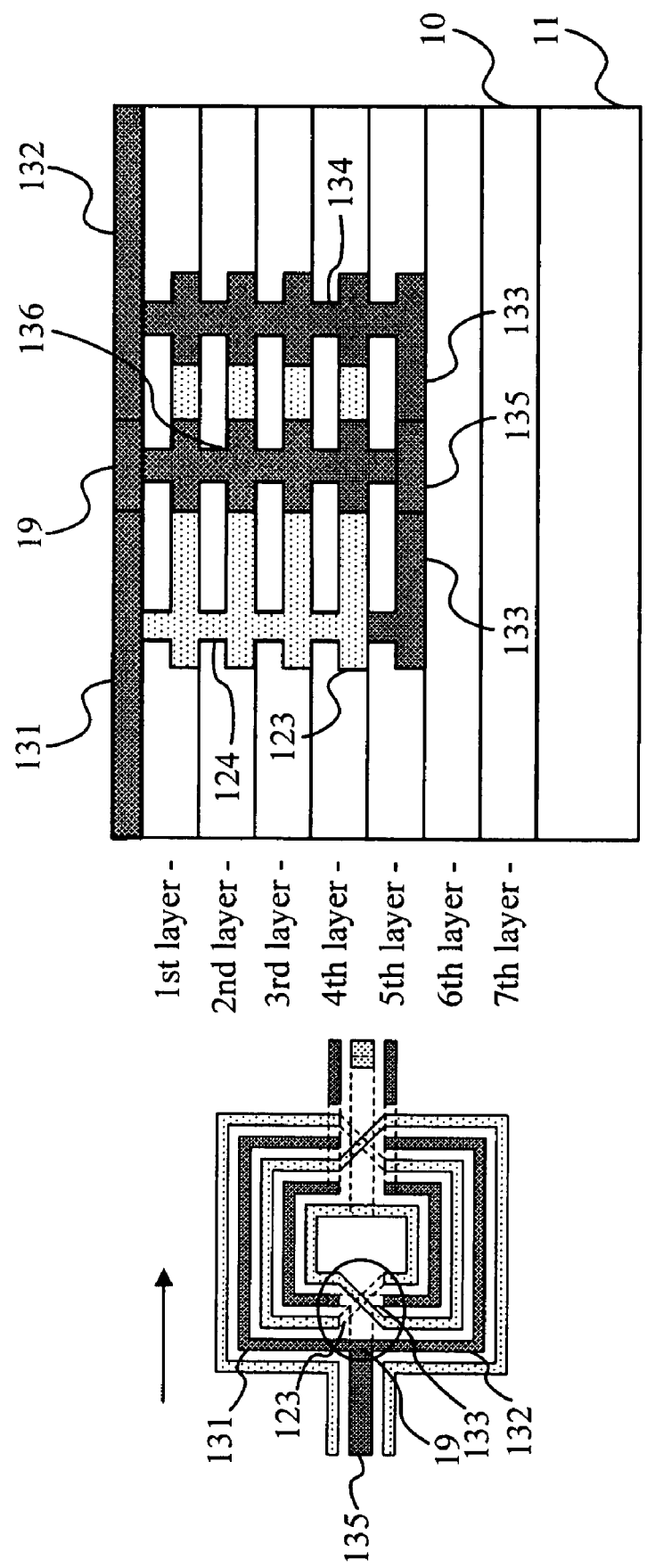
FIG. 4 is a third partial side view of FIG. 1.

FIG. 1 is a front view of an on-chip transformer balun according to a preferred embodiment of the invention. FIG. 2 is a first partial side view of FIG. 1. FIG. 2 includes a miniature diagram of FIG. 1 and the first partial side view. The first partial side view illustrates the circle part in the miniature diagram along the arrow direction in the miniature diagram. FIG. 3 is a second partial side view of FIG. 1. Similarly, FIG. 3 includes a miniature diagram of FIG. 1 and the second partial side view. The second partial side view illustrates the circle part in the miniature diagram along the arrow direction in the miniature diagram. FIG. 4 is a third partial side view of FIG. 1. Similarly, FIG. 4 includes a miniature diagram and the third partial side view. The third partial side view illustrates the circle part in the miniature diagram along the arrow direction in the miniature diagram. It is noticed that these partial side views are illustrated under the condition that the isolating layers are considered transparent, and the drawings in dotted line of the figures in this specification represent that they locate at the layer/layers below the surface of the 1st layer.

According to the preferred embodiment of the invention, the on-chip transformer balun 1 is formed among 7 successive isolating layers 10 wherein is on or over a semiconductor substrate 11, counted from top to bottom. The on-chip transformer balun 1 includes a primary winding 12 and a secondary winding 13. The primary winding 12 includes a plurality of first wire sections and a first metal bridge. The first wire sections include 3 first semi-turn coils 121 and 3 second semi-turn coils 122. The first semi-turn coils 121 and the second semi-turn coils 122 are on a primary metal layer, i.e. formed on the first isolating layer among the isolating layers 10 according to the preferred embodiment. Besides, the first metal bridge includes a plurality of first conducting sections 123 and a plurality of first vias 124. The first conducting sections 123 are located respectively on the metal layers different from the primary metal layer, i.e. formed among the second isolating layer through the 5th isolating layer among the isolating layer 10 according to the preferred embodiment. The first vias 124 couple the first conducting sections 123 and the first wire sections. That is, according to the preferred embodiment, each of the first conducting sections 123 connects one of the first semi-turn coils 121 with one of the second semi-turn coils 122 by use of the first vias 124 formed among the first isolating layer through the 4th isolating layer. Moreover, the primary winding 12 further includes a plurality of metal junctions 125. The metal junctions 125 are formed on the first isolating layer. Each of the metal junctions 125 connects one of the first semi-turn coils 121 and one of the second semi-turn coils 122.

The secondary winding 13 includes a plurality of second wire sections and a second metal bridge. The second wire sections include 2 third semi-turn coils 131 and 2 fourth semi-turn coils 132. The third semi-turn coils 131 and the fourth semi-turn coils 132 are on the primary metal layer, i.e. formed on the first isolating layer among the isolating layers 10 according to the preferred embodiment. The third semi-turn coils 131 are interlaced with the first semi-turn coils 121. The fourth semi-turn coils 132 are interlaced with the second semi-turn coils 122. Besides, the second metal bridge includes at least one second conducting section 133 and a plurality of second vias 134. Besides, the at least one second conducting section 133 is disposed respectively on the metal layers different from the primary metal layer, e.g. the 2nd isolating layer to the 6th isolating layer according to the preferred embodiment. The second vias 134 couple the at least one second conducting section 133 and the second wire sections. That is, according to the preferred embodiment, each of the second conducting section 133, by use of the second vias 134 formed among the first isolating layer through the 5th isolating layer among the isolating layers 10, connects one of the third semi-turn coils 131 and one of the fourth semi-turn coils 132, or one of the third semi-turn coils 131 and another of the third semi-turn coils 131, or one of the fourth semi-turn coils 132 and another of the fourth semi-turn coils 132.

Thereby, a current could flow through the first conducting sections 123 simultaneously to increase the allowable current. Therefore, the primary winding 12 could sustain a higher current than a conventional on-chip transformer balun in the same ratio of impedance transformation. Besides, the secondary winding 13 is formed with a plurality of coils in parallel, which increases the winding ration of the primary winding 12 and the secondary winding 13 so that the high-to-low impedance transformation could be achieved in the same transformation stage. In another embodiment, the wire width of at lease one of the first wire sections is different from the wire width of at lease one of the second wire sections whereby the high-to-low impedance transformation is adjustable.

Moreover, the primary winding 12 further includes a first port 14 and a second port 15. The first port 14 is coupled to the outermost first semi-turn coil of the first semi-turn coils 121. The second port 15 is coupled to the outermost second semi-turn coil of the second semi-turn coils 122. Besides, the second winding 13 further comprises a third port 17 and a fourth port 16. The fourth port 16 is coupled to the outermost third semi-turn coil of the third semi-turn coils 131 through the at least one second conducting section 133. The third port 17 is coupled to the outermost fourth semi-turn coil of the fourth semi-turn coils 132 through the at least one second conducting section 133.

In addition, the primary winding 12 and the secondary winding 13 respectively have a center trap 18, 19. By use of the above mentioned metal bridge structure, the center trap 18 of the primary winding 12 could be formed by connecting a plurality of third vias 127 and third conducting sections 126 formed from the 1st isolating layer to the 7th isolating layer, as shown in FIG. 3. Meanwhile, the layers and the layout used by the third conducting sections 126 are based on the actual current request. In addition, the center trap 19 of the secondary winding 13 is formed by connecting a plurality of fourth vias 136 and a fourth conducting section 135 formed from the 1st isolating layer to the 6th isolating layer, as shown in FIG. 4.

Figure 5:
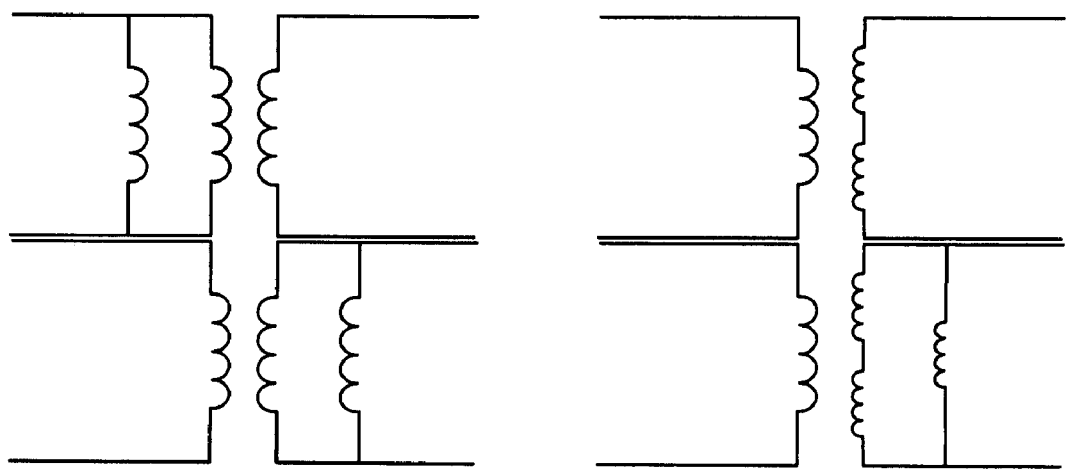
FIG. 5 is a diagram of series-parallel circuits according to the invention.

In actual applications, the primary winding and the secondary winding of the invention can be assembled in various series manners, parallel manners, or combination manners to obtain a required impedance matching. The schematic diagram is shown in FIG. 5.

Therefore, the on-chip transformer balun of the invention could sustain a higher current than a conventional transformer, save the layout area, and reduce the lost in power transformation.

With the recitations of the preferred embodiment above, the features and spirits of the invention will be hopefully well described. However, the scope of the invention is not restricted by the preferred embodiment disclosed above. The objective is that all alternative and equivalent arrangements are hopefully covered in the scope of the appended claims of the invention. Accordingly, the above disclosure is construed as limited only by the metes and bounds of the appended claims.

What is claimed is:

1. An on-chip transformer balun formed among N successive isolating layers from top to bottom on or over a semiconductor substrate, N being an integer larger than 4, said on-chip transformer balun comprising:
   a first winding, comprising:
      a plurality of first semi-turn coils formed on the first isolating layer among the isolating layers;
      a plurality of second semi-turn coils substantially symmetrical to the first semi-turn coils and formed on the first isolating layer among the isolating layers;
      a plurality of metal junctions formed on the first isolating layer among the isolating layers, each of the metal junctions connecting one of the first semi-turn coils with one of the second semi-turn coils; and
      a plurality of first conducting sections formed on the second isolating layer through the ith isolating layer among the isolating layers, i being an integer index ranging from 3 to (N−1), each of the first conducting sections, by use of a plurality of first vias formed among the first isolating layer through the (i−1)th isolating layer, connecting one of the first semi-turn coils with one of the second semi-turn coils; and a second winding, comprising:
- a plurality of third semi-turn coils interlaced with the first semi-turn coils and formed on the first isolating layer among the isolating layers;
- a plurality of fourth semi-turn coils substantially symmetrical to the third semi-turn coils, interlaced with the second semi-turn coils, and formed on the first isolating layer among the isolating layers; and
- a plurality of second conducting sections formed on the (i+1)th isolating layer among the isolating layers, each of the second conducting sections, by use of a plurality of second vias formed among the first isolating layer through the ith isolating layer, connecting one of the third semi-turn coils with one of the fourth semi-turn coils, or one of the third semi-turn coils with another of the third semi-turn coils, or one of the fourth semi-turn coils with another of the fourth semi-turn coils.

2. The on-chip transformer balun of claim 1, wherein the first winding further comprises a first port and a second port, the first port is coupled to the outermost first semi-turn coil of the first semi-turn coils, and the second port is coupled to the outermost second semi-turn coil of the second semi-turn coils.

3. The on-chip transformer balun of claim 1, wherein the second winding further comprises a third port and a fourth port, the fourth port is coupled to the outermost third semi-turn coil of the third semi-turn coils, and the third port is coupled to the outermost fourth semi-turn coil of the fourth semi-turn coils.

4. A transformer, comprising:
a first winding, comprising:
- a plurality of first wire sections on a primary metal layer; and
- a first metal bridge for coupling the first wire sections, said first metal bridge comprising:
  - a plurality of first conducting sections on metal layers different from the primary metal layer; and
  - a plurality of first vias for coupling the first conducting sections and the first wire sections; and a second winding, comprising:
- a plurality of second wire sections on the primary metal layer; and
- a second metal bridge for coupling the second wire sections, said second metal bridge comprising:
  - at least one second conducting section on metal layers different from the primary metal layer; and
  - a plurality of second vias for coupling the at least one second conducting section and the second wire sections.

5. The transformer balun of claim 4, wherein a wire width of at lease one of the first wire sections is different from a wire width of at lease one of the second wire sections.

* * * * *